(12) United States Patent
Lindley et al.

(10) Patent No.: US 6,937,026 B2
(45) Date of Patent: Aug. 30, 2005

(54) HIGH VOLTAGE INTERFACE MODULE

(75) Inventors: Ronnie J. Lindley, Canton, TX (US); Todd D. Ward, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 8 days.

(21) Appl. No.: 10/659,890

(22) Filed: Sep. 11, 2003

(65) Prior Publication Data

US 2005/0057260 A1 Mar. 17, 2005

(51) Int. Cl.[7] .............................................. G01R 31/08
(52) U.S. Cl. ........................................ 324/522; 324/537
(58) Field of Search .................................. 324/522, 537, 324/158.1, 119, 120, 73.1; 361/56; 702/66

(56) References Cited

U.S. PATENT DOCUMENTS

| | | | |
|---|---|---|---|
| 4,099,216 A | * 7/1978 | Weberg | .................... 361/56 |
| 4,698,740 A | * 10/1987 | Rodgers et al. | ................ 363/89 |
| 4,835,462 A | * 5/1989 | Konrad | ........................ 324/119 |
| 5,107,202 A | 4/1992 | Renda | ........................... 324/96 |
| 5,644,215 A | * 7/1997 | Casper | ......................... 323/274 |

FOREIGN PATENT DOCUMENTS

JP          55107132          6/1980   ........... G01R/15/04

* cited by examiner

Primary Examiner—Vincent Q. Nguyen
(74) Attorney, Agent, or Firm—Koestner Bertani, LLP

(57) ABSTRACT

The present invention provides a voltage conditioning interface module to condition an electrical signal locally. This module receives the unsafe electrical signal at an input port. This input port is electrically coupled to an external sampling point on an electrical circuit or system under test. A conditioning circuit having both a voltage reducing circuit and a voltage limiting circuit provides a reduced voltage. The voltage limiting circuit is in parallel with the output terminals that output the reduced voltage. This arrangement ensures that when a circuit element within the voltage reducing circuit fails, an unsafe condition does not exist across these terminals.

22 Claims, 4 Drawing Sheets

HIGH VOLTAGE INTERFACE MODULE

GOVERNMENT INTEREST

This invention was made with Government support under Contract Number N00019-02-C-3002 awarded by the Department of the Navy. The Government has certain rights in this invention.

TECHNICAL FIELD OF THE INVENTION

The present invention relates generally to voltage measurement systems and more particularly, a fail-safe system to measure unsafe voltages remotely by locally conditioning the measured voltages.

BACKGROUND OF THE INVENTION

Often complex electronic systems require the measurement of unsafe voltages. These voltages are typically those above 12–15 volts. Prior solutions have attempted to protect equipment and personnel from inadvertent encounters with unsafe voltages. Such encounters can result in electrical shock hazards to personnel, or damage or destruction of electrical circuits or surrounding equipment.

A typical solution reduces unsafe voltage with a voltage divider or resistor network. Such a circuit is shown in FIG. 1. Here an unsafe voltage input 12 is applied to conditioning circuit 10. For illustration purposes, resistor 14 and resistor 16 divide or reduce the unsafe input voltage and provide a reduced output voltage 18 as described by Equation 1:

$$Vout = Vin \frac{R_{16}}{(R_{14} + R_{16})} \quad \text{(Eq. 1)}$$

Equation 1 shows the ratio by which the unsafe voltage is reduced. Here the unsafe voltage is reduced by the ratio of resistor 16 to the sum of resistor 16 and resistor 14. When resistor 14 has a much bigger value than resistor 16, output voltage 18 is significantly less than the unsafe input voltage 12. However, this simply solution has serious drawbacks. If resister 14 fails in a short circuit condition, output voltage 18 fails to equal voltage of unsafe input voltage 12. This situation can result in high voltages being unexpectedly applied to circuits and creating a shock hazard to personnel. Similarly, when resister 16 fails open, the output voltage 18 is again equal to the unsafe input voltage 12. Thus, one needs to condition the sampled input voltages with a circuit to provide safe conditioned voltages for measurement purposes. Additionally, these lower voltages are more safely routed through wires or other circuit paths to test the equipment 20. Any damage to these insulators containing voltages 18 may pose a shock hazard to personnel or surrounding equipment if this voltage is at an unsafe level.

SUMMARY OF THE INVENTION

The present invention provides a high voltage interface system and method that substantially eliminates or reduces disadvantages and problems associated with previously developed voltage sampling methods used to measure unsafe voltages. More specifically, the present invention provides a voltage conditioning interface module to condition an electrical signal locally. This module receives the unsafe electrical signal at an input port. This input port is electrically coupled to an external sampling point on an electrical circuit or system under test.

A conditioning circuit having both a voltage reducing circuit and a voltage limiting circuit provides a reduced voltage. The voltage limiting circuit is in parallel with the output terminals that output the reduced voltage. This arrangement ensures that when a circuit element within the voltage reducing circuit fails, an unsafe condition does not exist across these terminals.

A first electrical pathway couples the received electrical signal to the conditioning circuit. This pathway typically employs high voltage carriers or leads. A second circuit pathway couples the modules output to a data acquisition or display.

In one embodiment, the voltage reducing circuit drops the unsafe voltage across a first resistance and a second resistance arranged in series. Typically the output terminals measure the voltage drop across the second resistance.

The voltage limiting circuit typically uses a transorb arranged in parallel to the second resistance. In one embodiment, the voltage limiting circuit uses a first diode aligned such that if a voltage across the output terminals exceeds the diodes breakdown voltage, the output terminals are shunted to a reference point. A second diode in the circuit is arranged in parallel to the first diode, but aligned such that forward current flow in the second diode is opposite that of the first diode. This arrangement ensures that should the second resistance fail as an open circuit, the output terminals are shunted to ground. The voltage limiting circuit guarantees that a single point failure in either the first resistance or the second resistance does not result in the reduced voltage output exceeding a predetermined safe voltage. To enhance safety, the voltage conditioning circuit may be encapsulated within an epoxy package.

Another embodiment provides method to locally condition a sample voltage signal. Here, sampling point(s) within a circuit under test couple via a first circuit pathway to provide the sampled unsafe-voltage signal to a voltage divider circuit. This sampling point may be located within a complex system having a plurality of sampling points coupled to a remote data acquisition system. Next, the sampled voltage drops across the voltage divider circuit. A reduced voltage measured across a portion of the voltage divider provides the reduced voltage output. The reduced voltage at the reduced voltage output is prevented from exceeding a predetermined voltage level by a voltage limiting circuit.

To facilitate the measurement process, the ratio of reduced voltage to the sampled voltage may be a constant ratio calculated according to Kirchhoff's law. Foe example, the ratio of the second resistance to the sum of the first resistance and the second resistance in one embodiment is about 1/101.01. Additionally, in most applications, the measured electrical signal does not exceed about 600 volts and the reduced voltage does not exceed about 40 volts. The reduced voltage output may then be provided to a data acquisition system or display (meter) through a second circuit pathway.

Yet another embodiment provides a voltage interface module to locally condition a potentially unsafe electrical signal sampled from within a complex system. An input port electrically couples to receive the unsafe electrical signal from an external sampling point within the complex system. A conditioning circuit encapsulated within epoxy, contains a voltage divider circuit having a first resistance and a second resistance. The voltage output is taken across the second resistance to provide a reduced voltage output. This voltage is protected from an over voltage condition by a voltage limiting circuit arranged in parallel with the second resistance. The limiting circuit bounds the reduced voltage across the output terminals when either the first resistance or the second resistance fails. A second set of electrical leads may couple the output terminals to a data acquisition system or display.

The voltage limiting circuit may contain a transorb or other like device known to those skilled in the art. In another embodiment, the voltage limiting circuit has two diodes. The first diode is aligned such that if the reduced voltage across the output terminals exceeds the diode's breakdown voltage, the output terminals are shunted to a reference point or ground.

The second diode is arranged in parallel to the first diode but is aligned such that forward current flow in the second diode is opposite that of the first diode. The second diode prevents an unsafe voltage from being applied to the output terminals when the second resistance fails in any open circuit condition.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

Figure 1:
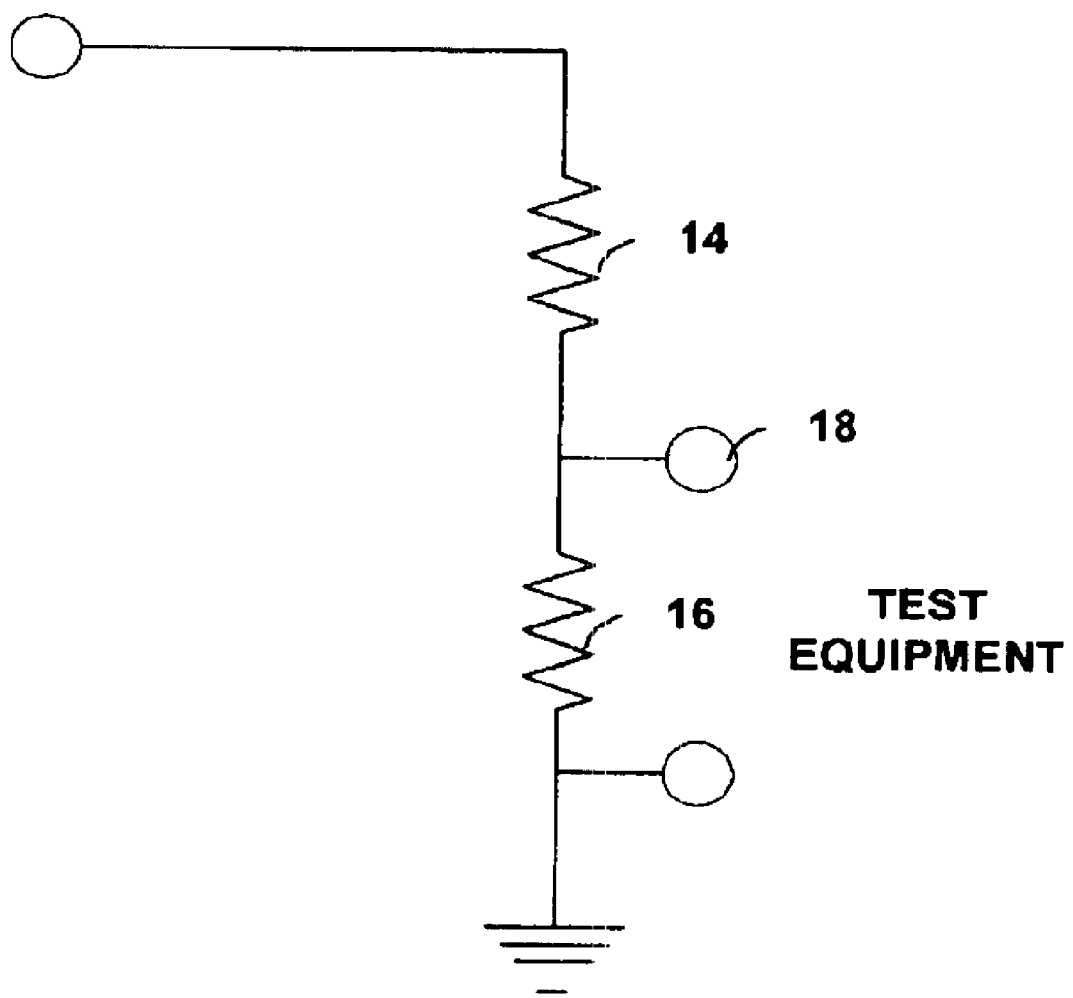
FIG. 1 depicts a prior art method by which the sampled voltage could be reduced.
Figure 2:
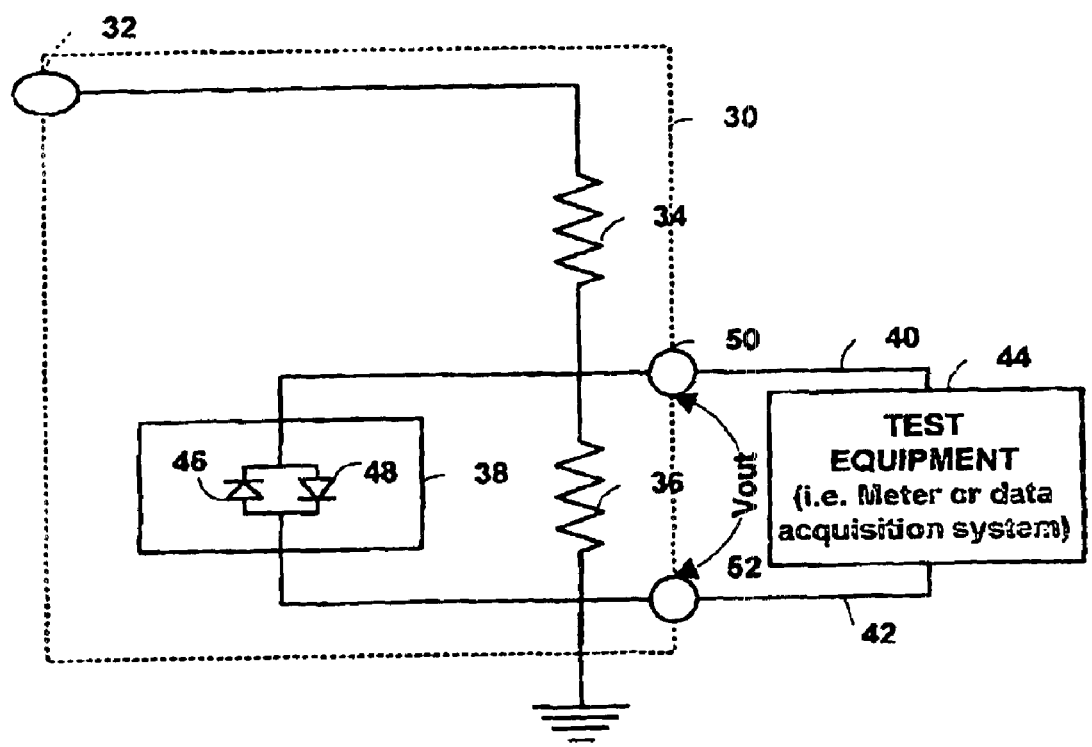
FIG. 2 provides a circuit that reduces the sampled voltage by a predetermined ratio while providing a guarantee of over voltage protection.

In one embodiment, the disclosure provides a high voltage interface module used to reduce unsafe voltage to safe levels. As illustrated by the circuit contained in FIG. 2, a high or unsafe voltage input 32 is applied to circuit 30. Input voltage 32, drops across the voltage divider circuit having resistor 34 and resistor 36. The output voltage equals the portion of input voltage dropped across the terminals of resistor 36. The valve equals input voltage 32 reduced by the ratio of resistor 36 to the value of resistor 36 summed with resistor 34.

Transorb 38 prevents a failure in either resistor 34 or resistor 36 from resulting in the presence of a shock or other electrical hazard. This hazard would be carried within leads 40 and 42, used to carry the output voltage to test equipments 44. Transorb 38 may comprise a pair of oppositely aligned diodes 46 and 48. When diode 46 breaks down, for example, at 40 volts. Such a condition may occur if resistor 34 were to short-circuit. Similarly, if resistor 36 were to open circuit, the resulting the output voltage across the terminals of resistor 36 would be shunted to the reference point or ground by diode 48. In this condition, terminals 50 and 52 are connected to the reference points where diode 48 shunts input voltage 32.

This circuit, designed to be installed at or near a high-voltage sampling point, reduces the need to run dangerous high-voltage leads from the sampling point to testing equipment 44. In one example, input voltage 32 is reduced by a ratio of 1/101.01. The output voltage, as previously stated, may be limited by a 40-volt transorb in the event of any signal element failure. The reduced-voltage output, measured across the terminals of resistor 36, runs to a data acquisition system or to a meter (display). As described, this system employs passive components and requires no adjustments or calibration. Additionally, the described results eliminate the need for high-voltage leads in favor of low-voltage leads 40 and 42. The low-voltage leads carry voltages that do not pose a shock hazard to personnel or an electrical hazard to equipment. This reduces risk associated with testing complex equipment containing high or unsafe voltages and has many industrial applications.

Figure 3:
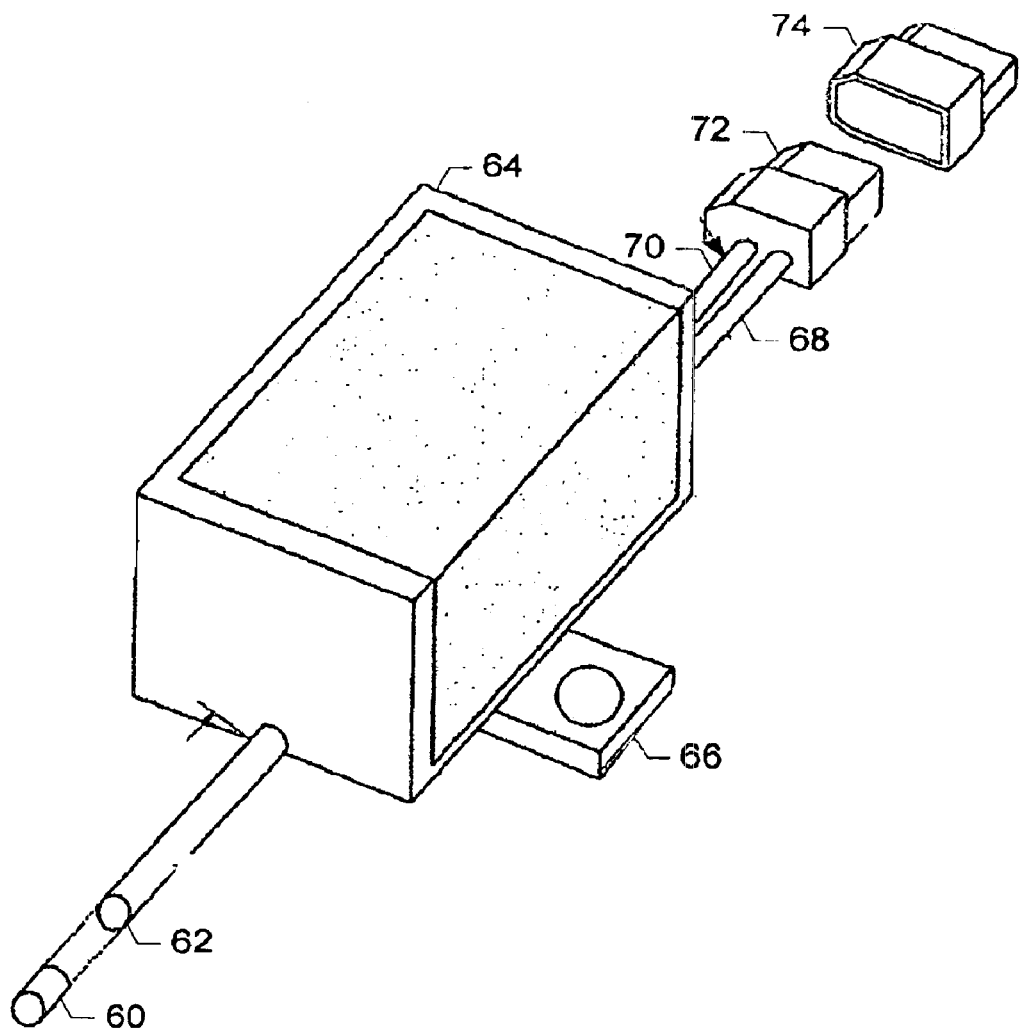
FIG. 3 provides a pictorial view of one embodiment of an interface module taught by this disclosure.

FIG. 3 provides an isometric view of one embodiment of a high-voltage interface module. Here leads 60 and 62 couple to sampling points for a high-voltage output. The high-voltage outputs to a circuit functionally equivalent to that described in FIG. 2. In this case, this circuit is encapsulated within potted box enclosure 64. This enclosure protects technicians working on the circuit. Copper tab 66 serves as the reference or ground of the previously described circuit of FIG. 2. Low-voltage leads 68 and 70 route the output voltage to data collection equipment. The connection passes through electrical connections 72 and 74.

Figure 4:
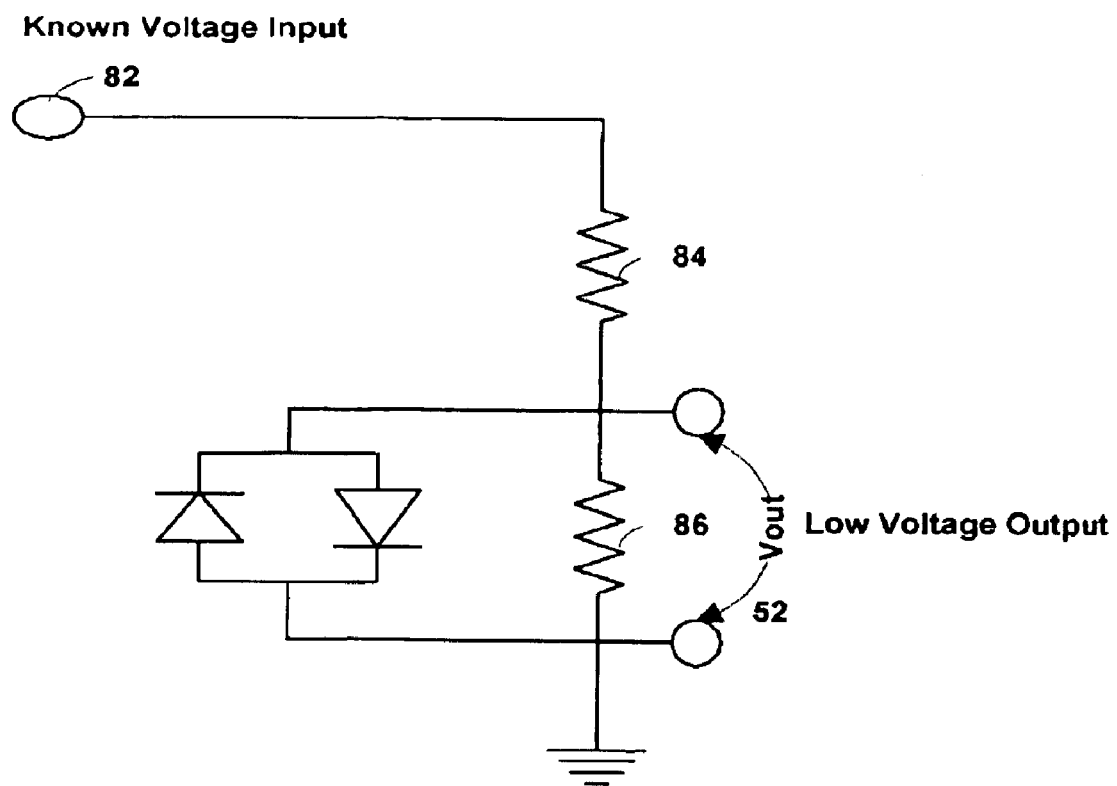
FIG. 4 describes how the ratio of resistances within the circuit may be determined with a known voltage point and measured voltage output.

The passive nature of the circuit ensures that once the circuit is constructed, its functional characteristics may be easily determined by samples a known voltage. FIG. 4 illustrates that a known voltage input 82 is applied to the circuit 85. Resistor 86 allows a low-voltage output measurement to be taken across terminals 88 of resistor 86. The known input voltage and measured output voltage provide a constant ratio by which all future measurements using this high-voltage interface module may be ratioed as defined by Equation 2:

$$\frac{V_{out}}{V_{in}} = \frac{R_{36}}{(R_{34} + R_{36})} \quad \text{(Eq. 2)}$$

Equation 2 shows the ratio of the low voltage output ($V_{out}$) to the Known Voltage Input ($V_{in}$) equals to the ratio of the value of resistor 86 to the sum of resistors 86 and 84.

The empirically determined ratio remains constant over the life of the interface module and may typically be quickly determined by the relationship continued in Equation 2. Equation 3 uses the empirically determined ratio of Equation 2 to determine the value of $V_{unknown}$.

$$V_{unknown} = V_{measured} \frac{Vin}{V_{out}} \quad \text{(Eq. 3)}$$

For example, the ratio in Equation 2 may be recorded in data associated with the individual interface module for later use when sampling input voltages of an unknown value(s). The measured voltage is in Equation 3 shows that an unknown high-voltage input may be easily calculated as the product of a measured low voltage output ($V_{measured}$) and the inverse ratio described in Equation 2. The ratio of a known high-voltage input ($V_{in}$) to its measured low-voltage output ($V_{out}$) equals the ratio of the resistor values.

The disclosed voltage interface module provides the ability to safely sample high-voltage signals and condition those signals locally at the point of measurement. Then these signals are routed via low-voltage leads to data collection equipment. This arrangement avoids potential shock hazards to which previous high-voltage measurement systems were susceptible. Thus, the present invention provides a safe and simple means to measure unsafe voltages in a complex system while protecting equipment and personnel from inadvertent and unexpected encounters with high-voltages. This system has numerous industrial applications, and ensures that should a signal element failure occur, the output of the interface module remains at a safe voltage level.

Although the present invention is described in detail, it should be understood that various changes, substitutions and alterations can be made hereto without departing from the spirit and scope of the invention as described by the appended claims.

What is claimed is:

1. A high voltage conditioning interface module to condition an electrical signal locally, comprising:
    an input port to receive the electrical signal from an external sampling point;
    a conditioning circuit, wherein the conditioning circuit comprises:
        a voltage reducing circuit having output terminals to output a reduced voltage to test equipment wherein the test equipment is coupled to the output terminals by a low-voltage circuit pathway; and
        a voltage limiting circuit in parallel with the output terminals to limit a voltage across the output terminals when a circuit element within the voltage reducing circuit and parallel to the output terminals fails open or short circuits; and
    a first electrical pathway to electrically couple the received electrical signal to the conditioning circuit.

2. The voltage conditioning circuit of claim 1, wherein the voltage reducing network comprises:
    a first resistance; and
    a second resistance in series with the first resistance, wherein the output terminals are across the second resistance.

3. The voltage conditioning circuit of claim 2, wherein the ratio of the second resistance to the sum of the first resistance and the second resistance is about 1/101.01.

4. The voltage conditioning circuit of claim 1, wherein the voltage limiting circuit comprises a transorb.

5. The voltage conditioning circuit of claim 1, wherein the voltage limiting circuit comprises:
    a first diode aligned such that if a voltage across the output terminals exceeds a breakdown voltage, the output terminals are shunted to a reference point; and
    a second diode in parallel to the first diode but aligned such that forward current flow in the second diode is opposite that of the first diode.

6. The voltage conditioning circuit of claim 1, wherein:
    the electrical signal does not exceed about 600 volts; and
    the reduced voltage does not exceed about 40 volts.

7. The voltage conditioning circuit of claim 1, wherein the reduced voltage signal is provided to a data acquisition system.

8. The voltage conditioning circuit of claim 1, wherein an epoxy package encapsulates the conditioning circuit.

9. The voltage conditioning circuit of claim 1, wherein the reduced voltage signal is provided to a test equipment.

10. The voltage conditioning circuit of claim 1, wherein a failure in either the first resistance or the second resistance does not result in a reduced voltage exceeding a predetermined safe voltage.

11. A method to locally condition a sampled high voltage signal, comprising:
    locally coupling a first circuit pathway to a sampling point;
    providing the sampled voltage signal to a voltage divider circuit;
    dropping the sampled voltage across the voltage divider circuit;
    sampling a reduced voltage at a reduced voltage output;
    preventing the reduced voltage at the reduced voltage output from exceeding a predetermined voltage level;
    coupling the reduced voltage output to a remote test system with a low-voltage circuit pathway; and
    reading the reduced voltage output with data collection equipment.

12. The method of claim 11, wherein a ratio of the reduced voltage to the sampled voltage is a constant ratio.

13. The method of claim 11, wherein preventing the reduced voltage at the reduced voltage output from exceeding a predetermined voltage level further comprises placing a voltage limiting circuit in parallel with the voltage divider circuit at the reduced voltage output.

14. The method of claim 11, further comprising providing the reduced voltage output to a data acquisition system through a second circuit pathway.

15. The method of claim 11, wherein the sampling point is within a complex system having a plurality of sampling points coupled to remote data acquisition systems.

16. A voltage conditioning interface module to locally condition an electrical signal sampled within a complex system, comprising:
    an input port to receive the electrical signal from an external sampling point within the complex system;
    an epoxy package encapsulating a conditioning circuit, wherein the conditioning circuit comprises:
        a voltage divider circuit having a first resistance and a second resistance, wherein output terminals are across the second resistance to provide a reduced voltage output; and
        a voltage limiting circuit in parallel with the output terminals to limit the reduced voltage across the output terminals when either the first resistance or the second resistance fails;
    a first electrical pathway to electrically couple the received electrical signal to the conditioning circuit; and
    a low voltage circuit pathway is operable to couple the output terminals to a remote data collection equipment.

17. The voltage conditioning circuit of claim 16, wherein the voltage limiting circuit comprises a transorb.

18. The voltage conditioning circuit of claim 16, wherein the voltage limiting circuit comprises:
    a first diode aligned such that if the reduced voltage across the output terminals exceeds a breakdown voltage, the output terminals are shunted to a reference point; and
    a second diode in parallel to the first diode but aligned such that forward current flow in the second diode is opposite that of the first diode.

19. The voltage conditioning circuit of claim 16, wherein the ratio of the second resistance to the sum of the first resistance and the second resistance is about 1/101.01.

20. The voltage conditioning circuit of claim 16, wherein:
    the electrical signal does not exceed about 600 volts; and
    the reduced voltage does not exceed about 40 volts.

21. The voltage conditioning circuit of claim 16, wherein the reduced voltage is provided to a data acquisition system.

22. The voltage conditioning circuit of claim 16, wherein a failure in either the first resistance or the second resistance does not result in a reduced voltage exceeding a predetermined safe voltage, and wherein the failure comprises an open circuit or short circuit.

* * * * *